United States Patent [19]

Bellar et al.

[11] Patent Number: 5,270,902
[45] Date of Patent: Dec. 14, 1993

[54] HEAT TRANSFER DEVICE FOR USE WITH A HEAT SINK IN REMOVING THERMAL ENERGY FROM AN INTEGRATED CIRCUIT CHIP

[75] Inventors: Robert J. Bellar; Sung J. Kim; Alan L. Murphy, all of Tucson, Ariz.

[73] Assignee: International Business Machines Corporation, Armonk, N.Y.

[21] Appl. No.: 991,865

[22] Filed: Dec. 16, 1992

[51] Int. Cl.$^5$ ............................................. H05K 7/20
[52] U.S. Cl. .................................... 361/718; 165/185; 174/16.3; 257/707; 257/713; 361/702
[58] Field of Search .............. 257/706, 707, 713, 718, 257/719, 725; 165/80.2, 80.3, 46, 185; 174/16.3; 361/382, 383, 386-389, 400

[56] References Cited

U.S. PATENT DOCUMENTS

| | | | |
|---|---|---|---|
| 4,156,458 | 5/1979 | Chu | 165/185 |
| 4,235,283 | 11/1980 | Gupta | 165/80.3 |
| 4,471,837 | 9/1984 | Larson | 165/185 |
| 5,006,924 | 4/1991 | Frankeny | 361/386 |
| 5,022,462 | 6/1991 | Flint | 165/80.4 |
| 5,168,348 | 12/1992 | Chu | 257/713 |

OTHER PUBLICATIONS

"Circuit Module ... Transfer", IBM Tech. Discl. Bull. vol. 20, No. 6, Nov. 1977, Nuccio et al, p. 2329 (361-386).
"New ... Cooling", IBM Tech. Disc. Bull. vol. 28 No. 12 May 1986, pp. 5504, 5505.

*Primary Examiner*—Gerald P. Tolin
*Attorney, Agent, or Firm*—William J. Benman, Jr.

[57] ABSTRACT

A heat transfer device for use with a heat sink in removing thermal energy from an integrated circuit chip. The inventive device includes a first membrane of flexible, thermally conductive material having a first surface in contact with the integrated circuit chip. A flexible, thermally conductive radial finger contact spring is disposed in contact with a second surface of the first membrane. A second membrane of flexible, thermally conductive material is included. The second membrane has a first surface in contact with the spring and a second surface in contact with the heat sink.

6 Claims, 2 Drawing Sheets

_5,270,902_

HEAT TRANSFER DEVICE FOR USE WITH A HEAT SINK IN REMOVING THERMAL ENERGY FROM AN INTEGRATED CIRCUIT CHIP

BACKGROUND OF THE INVENTION

1. Field of the Invention

The present invention relates to devices for cooling integrated circuits. More specifically, the present invention relates to heat sinks and related devices.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Thermal control of electronic devices is important as heat affects functionality as well as reliability. Heat generation from semi-conductor devices, if not removed, can damage the device and cause catastrophic failure.

The trend in electronic cooling design is away from individual chips mounted on substrates and toward arrays of chips in a single pack. When the surface heat flux from the chips is large, a heat sink is needed to conduct heat from the chip. If there are many chips and little space, the chips are typically attached to a large area heat sink.

In order to remove heat generated by the chips efficiently, an improved conduction path for heat transfer between the chips and the heat sink is essential. The attachment of the heat sink directly to the chip has to be capable of handling differences in thermal expansion between different materials and the tolerances (variations in height) of multi-chip arrays. Hence, for mechanical type connections, the interface must be flexible.

Certain techniques are known in the art for providing improved conduction in heat transfer connections. For instance, U.S. Pat. No. 4,235,283 issued Nov. 25, 1980, to Gupta discloses a multi-stud module for removing the heat from the chip array. The disclosed module comprises a housing made of heat conducting material forming a cap over the circuit chips. The housing contains an opening at the location of each chip. Spring loaded studs are assembled in the openings. The studs become the heat conducting element with the end of each stud in contact with the associated chip.

Another conduction heat transfer connection is described in U.S. Pat. No. 4,156,458 issued May 29, 1979, to Chu et al. The connection comprises a heat conductive metallic foil bundle of sufficient thickness to contact the surface area of each chip for the required heat transfer. The connection is designed to be flexible enough to absorb the expansion and contraction due to temperature changes and the tolerance variations between the chips and the heat sink or a cold plate.

While numerous other heat transfer connections are known in the art, the conventional devices and methods are generally limited and may not solve some thermal design problems within the designer's cost and space limitations. Thus, a need remains in the art for further improvements in heat transfer connections, devices and mediums.

SUMMARY OF THE INVENTION

The need in the art is addressed by the present invention which provides a heat transfer device for use with a heat sink in removing thermal energy from an integrated circuit chip. The inventive device includes a first membrane of flexible, thermally conductive material having a first surface in contact with the integrated circuit chip. A flexible, thermally conductive radial finger contact spring is disposed in contact with a second surface of the first membrane. A second membrane of flexible, thermally conductive material is included. The second membrane has a first surface in contact with the spring and a second surface in contact with the heat sink.

The invention adapts itself to variations in chip heights and placements and allows for different thermal expansion coefficients of the materials used.

DESCRIPTION OF THE INVENTION

Illustrative embodiments and exemplary applications will now be described with reference to the accompanying drawings to disclose the advantageous teachings of the present invention.

Figure 1:
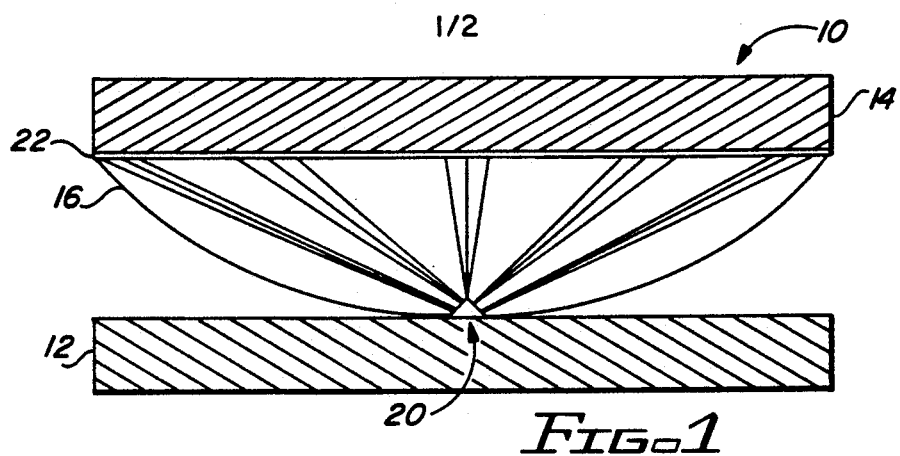
FIG. 1 is side elevational view of the heat transfer device of the present invention.

FIG. 1 is side elevational view of the heat transfer device of the present invention. The device 10 includes first and second flexible membranes 12 and 14 and a radial finger contact spring 16 sandwiched therebetween. The first and second flexible membranes 12 and 14 are constructed to provide low thermal resistance and sufficient compliance to conform to a substrate. In the best mode, the membranes are constructed of expanded graphite particles compressed to form a sheet of material such as Graphoil, a product of the Union Carbide Corporation. The first membrane 12 is designed to provide a good thermal interface with an integrated circuit chip. The second membrane 14 is designed to provide a good thermal interface with a heat transfer device such as a heat sink.

The dimensions of the membranes may be determined by one skilled in the art to suit the requirements of a particular application. In general, the first membrane 12 will be sized to fit an array of integrated circuit chips. The second membrane 14 is sized to fit a heat sink. The thickness of each membrane is chosen in a conventional manner taking into account the fact that the thicker the material, the higher the thermal resistance and the better the compliance.

Thermal energy is transferred from an integrated circuit chip (not shown in FIG. 1) to the heat sink by the first membrane 12, the radial finger contact spring 16 and the second membrane 14.

Figure 2A:
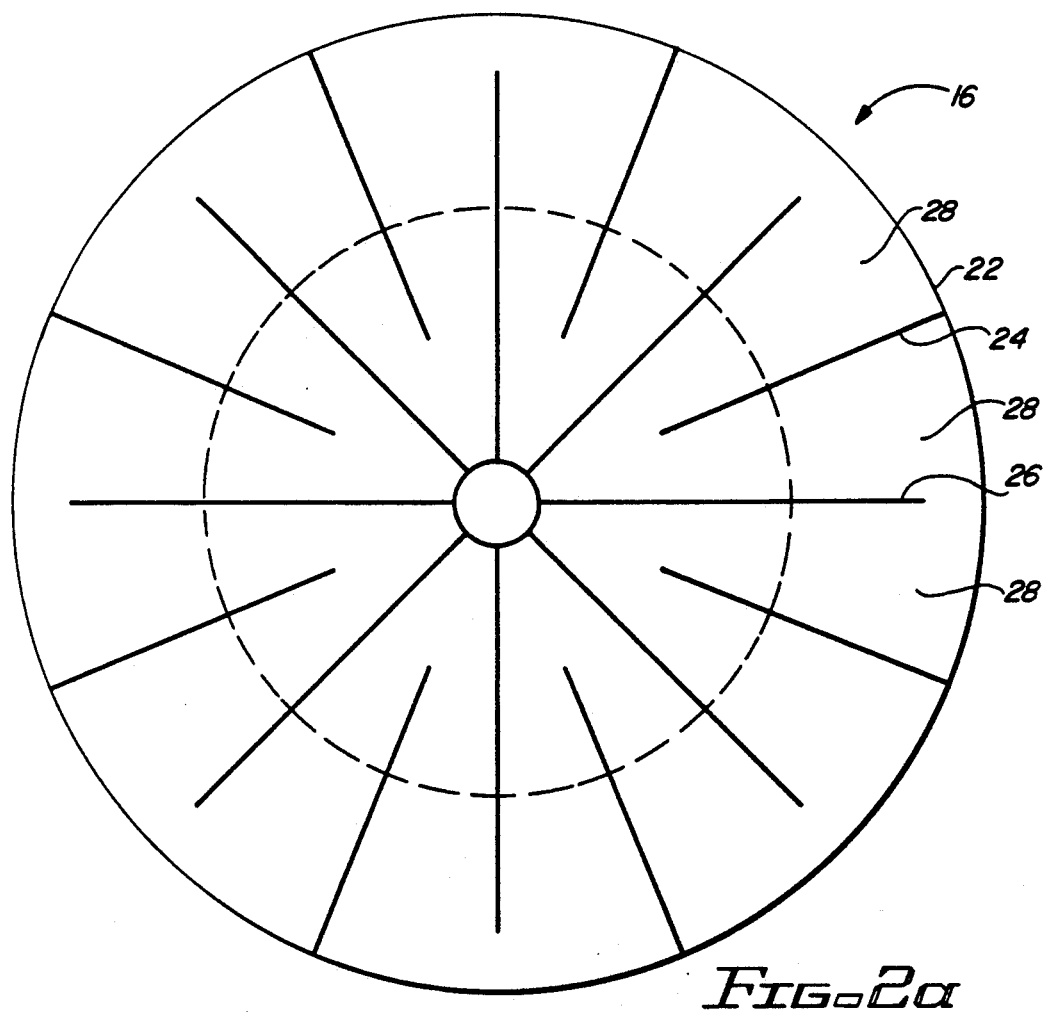
FIG. 2a is a top view of the radial finger contact spring utilized in the heat transfer device of the present invention.
Figure 2B:
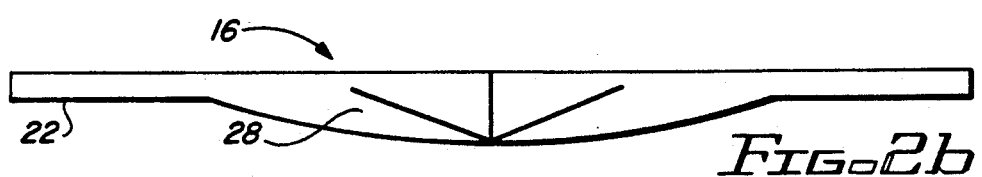
FIG. 2b is a side elevational view of the radial finger contact spring utilized in the heat transfer device of the present invention.

As illustrated in FIGS. 2a and 2b, the radial finger contact spring 16 includes a ring of beryllium-copper, stainless steel or other suitable material. FIG. 2a is a top view of the radial finger contact spring utilized in the heat transfer device of the present invention. FIG. 2b is a side elevational view of the radial finger contact spring 16 utilized in the heat transfer device 10 of the present invention. A plurality of slits 24, 26 are cut in the ring 22 to provide a number of fingers 28. The slits allow the fingers 28 to deform under pressure. The spring 16 allows the device 10 to adjust to the height of the chip relative to the heat sink, while maintaining good thermal conductivity therebetween.

Returning to FIG. 1, the ring 22 of the spring 16 is bonded at one point only of the periphery to the second membrane 14 with a thermally conductive adhesive. This allows the periphery to expand when compressed. The top of the spring 16 is attached to the first membrane 12 with a thermal adhesive. In the alternative, the inside surfaces of the first and second membranes 12 and 14 may be plated to facilitate a soldering of the spring 16 thereto.

Figure 3:
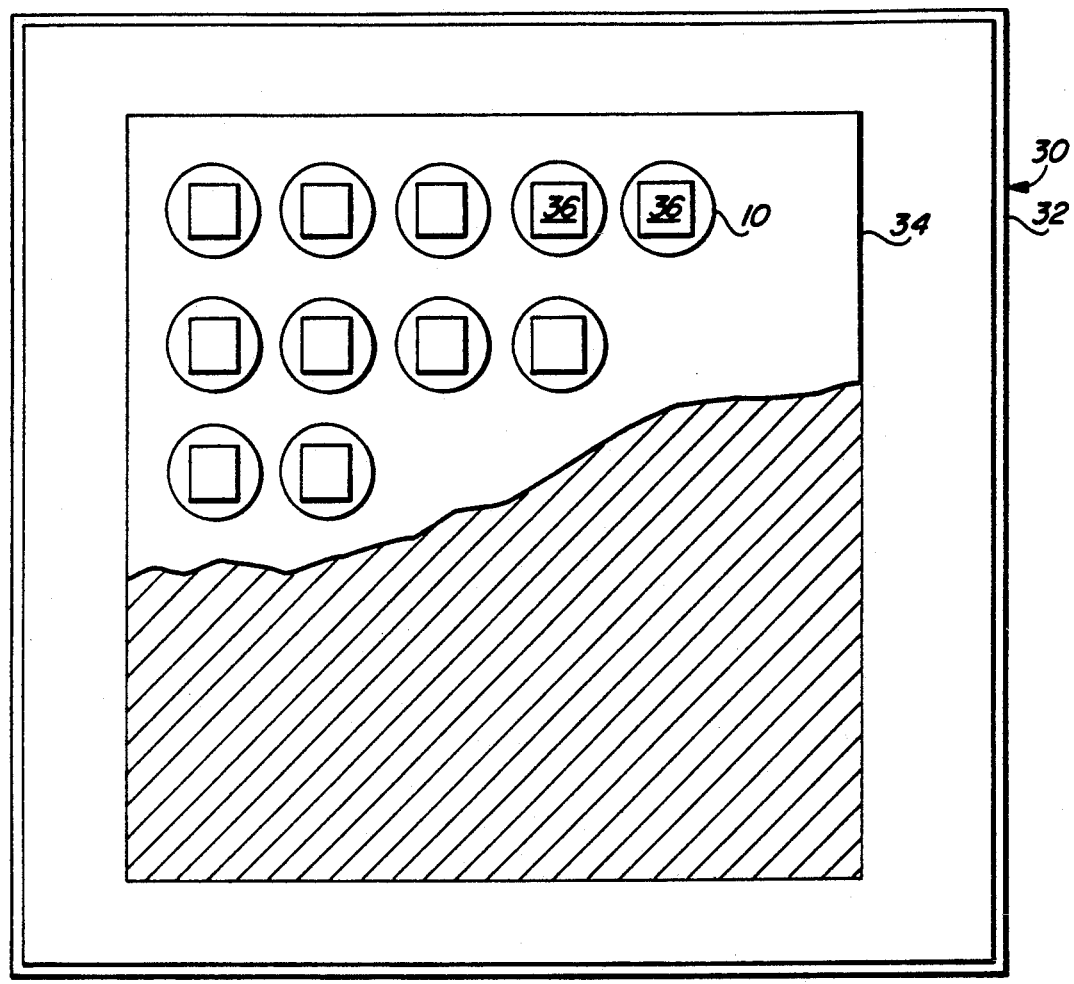
FIG. 3 is a partially exposed top view of an integrated circuit array with a plurality of heat transfer devices constructed in accordance with the present teachings.

FIG. 3 is a partially exposed top view of an arrangement with a heat sink 32 disposed over an integrated circuit array 34 of integrated circuit chips 36. A plurality of heat transfer devices 10 constructed in accordance with the present teachings is sandwiched between one of the chips 36 and the heat sink 32.

Figure 4:
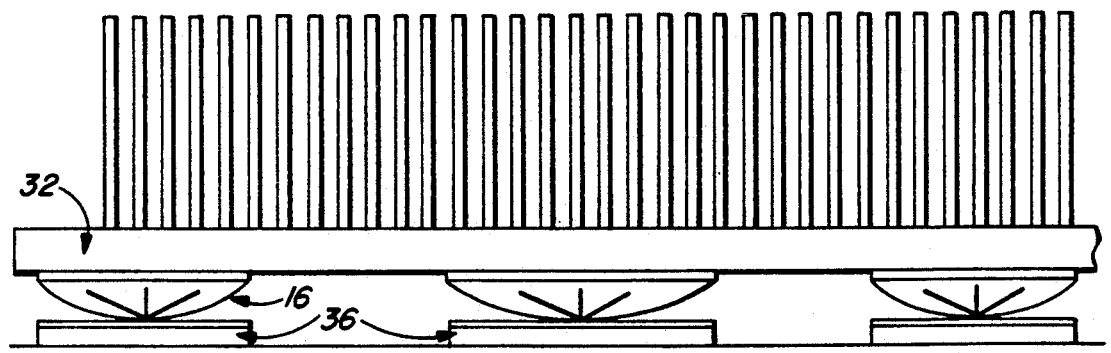
FIG. 4 is a side view of an arrangement showing the heat transfer devices of the present invention between a plurality of integrated circuit chips and a heat sink.

FIG. 4 is a side view of the arrangement 30 showing the heat transfer devices of the present invention between a plurality of integrated circuit chips 36 and the heat sink 32.

The thermal resistance of the device 10 may be reduced further by filling the cup area with graphite particles. This will make the void small between the spring 16 and the second membrane 14. In the alternative, the graphite material can be added to the second membrane.

Thus, the present invention has been described herein with reference to a particular embodiment for a particular application. Those having ordinary skill in the art and access to the present teachings will recognize additional modifications applications and embodiments within the scope thereof. For example, the invention is not limited to implementation in discrete devices. The invention may be integrated into a heat sink. In the alternative, several devices may share a top or bottom membrane.

It is therefore intended by the appended claims to cover any and all such applications, modifications and embodiments within the scope of the present invention.

Accordingly,

What is claimed is:

1. A heat transfer device for use with a heat sink in removing thermal energy from an integrated circuit chip, said device comprising:

a first membrane of flexible, thermally conductive material having a first surface in contact with said integrated circuit chip;

a flexible, thermally conductive radial finger contact spring disposed in contact with a second surface of said first membrane; and a second membrane of flexible, thermally conductive material having a first surface in contact with said spring and a second surface in contact with said heat sink.

2. The invention of claim 1 wherein said spring includes a ring and a plurality of flexible elements extending radially therefrom.

3. The invention of claim 2 wherein said spring is constructed of beryllium-copper.

4. The invention of claim 2 wherein said first and second membranes are constructed of expanded graphite.

5. The invention of claim 4 wherein said first and second membranes are constructed of Graphoil.

6. A heat transfer device for use with a heat sink in removing thermal energy from an integrated circuit chip, said device comprising:

a first membrane of flexible, thermally conductive material having a first surface in contact with said integrated circuit chip;

a flexible, thermally conductive radial finger contact spring including a ring and a plurality of flexible elements extending radially therefrom, said ring being bonded to said a second surface of said first membrane; and a second membrane of flexible, thermally conductive material having a first surface in contact with said spring and a second surface in contact with said heat sink.

* * * * *